United States Patent [19]

Tsuyuguchi et al.

[11] Patent Number: 5,010,246
[45] Date of Patent: Apr. 23, 1991

[54] OPTICAL HEAD APPARATUS APPLICABLE TO OPTICAL DISC APPARATUS

[75] Inventors: Hiroshi Tsuyuguchi; Yasushi Noda, both of Tokyo; Tsutomu Morita, Mitaka; Kenji Shimozawa, Sagamihara, all of Japan

[73] Assignee: TEAC Corporation, Japan

[21] Appl. No.: 464,975

[22] Filed: Jan. 16, 1990

[30] Foreign Application Priority Data

Jan. 18, 1989 [JP] Japan ................................ 1-3939[U]

[51] Int. Cl.⁵ .......................... H01J 3/14; H01J 5/16; G11B 7/00
[52] U.S. Cl. ..................................... 250/216; 369/112
[58] Field of Search .............................. 250/216, 239; 369/44.12, 112

[56] References Cited

U.S. PATENT DOCUMENTS

| 4,687,924 | 8/1987 | Galvin et al. | 250/216 |
| 4,760,568 | 7/1988 | Hine | 369/44.12 |
| 4,868,820 | 9/1989 | Nagashima et al. | 369/112 |
| 4,935,911 | 6/1990 | Ohuchida et al. | 369/44.12 |
| 4,937,808 | 6/1990 | Shimada et al. | 369/112 |

FOREIGN PATENT DOCUMENTS 90189 1/1989 Japan .

Primary Examiner—David C. Nelms
Assistant Examiner—Stephone B. Allen
Attorney, Agent, or Firm—Andrus, Sceales, Starke & Sawall

[57] ABSTRACT

An optical head apparatus applicable to an optical disc apparatus comprises, a case body having an open surface and a window through which an opto-electronic component can be positioned and housing optical components inside it, a lid being attachable and detachable with respect to the open surface of the case body, and a flexible printed circuit board having a base portion which is adhered to the lid and on which electronic components are mounted and a protruding portion protruding from the base portion and having an opto-electronic component fixed to the distal end portion of it, the opto-electronic component being electrically connected with an electronic circuit which is formed by the electronic components, the distal end portion of the protruding portion of the flexible printed circuit board being fixed to the case body so that the opto-electronic component is position to the window.

8 Claims, 5 Drawing Sheets

OPTICAL HEAD APPARATUS APPLICABLE TO OPTICAL DISC APPARATUS

BACKGROUND OF THE INVENTION

The present invention relates to an optical head apparatus applicable to an optical disc apparatus.

After this type of optical head apparatus is assembled, it is sometimes required to perform an optical adjustment or an exchange and/or a repair of optical components and the like. Accordingly, it is desirable that the structure facilitate the optical adjustment and the like performed after assembly.

The structure of a conventional optical head 10 is shown for example, in FIG. 1 and FIG. 2. The optical head 10 shown in FIG. 1 and FIG. 2 is disclosed in Japanese Utility Model Laid Open Application No. 90189/1989.

The optical head 10 has a case body 12 and a lid 13. The outer shape of the case body 12 is rectangular parallelepiped, with the top surface open. In the case body 12 are stored lenses, mirrors, prisms and other optical components 9. A printed circuit board (not indicated in the figure) having a pattern formed is fixed in the lid 13 and this printed circuit board has IC, transistors, condensors, resistors and other electronic components inserted into it and fixed with solder or the like. The circuit configured by wiring these electronic components on the printed circuit board is a laser output control circuit and the like. The lid 13 is placed over the opening of the case body 12 and fixed in place on the case body 12 with screw 11a and 11b.

Two side surfaces of the case body 12 are provided with light receiving element 17 (such as a photodetector) and light emitting element 18 (such as a semiconductor laser). The light receiving element 17 and light emitting element 18 are in electrical contact with contact wiring 15 and 16. Then, in the status where the lid 13 is mounted to the case body 12, the contact wiring 15 (16) is connected to a connector 19 provided on the lid 13. When the contact wiring 15 (16) is connected to the connector 19, the light receiving element 17 and the light emitting element 18 are brought into electrical contact with the electronic components provided in the lid 13.

In a structure such as that described above, after the optical head 10 has been assembled, when readjustment of the optical components 9 inside the case body 12 is performed, it is necessary to remove the lid 13 from the case body 12. However, it is not possible to remove the lid 13 while the contact wiring 15 and 16 are connected to the connector. Accordingly, when the lid 13 is removed from the case body 12, it is necessary to detach the contact wiring 15 and 16 from the connector. In addition, when the optical components 9 are adjusted, the light emitting element 18 and the light receiving element 17 are made active and so it is necessary to connect the contact wiring 15 and 16 to the connector once again after the lid 13 has been removed from the case body 12.

In addition, when position adjustment of the light receiving element 17 on the side surface of the case body 12, it is also necessary to remove the lid 13 from the case body 12.

As has been described above, in a conventional optical head 10, when readjustment and other operations are performed for the optical components 9, it is necessary to remove the contact wiring 15 and 16 from the connector and to reconnect them and these operations require unnecessary time and trouble.

SUMMARY OF THE INVENTION

Accordingly, it is a general object of the present invention to provide a new and novel optical head apparatus that is effectively applicable to optical disc apparatus and in which the problem inherent to the conventional apparatus is not present.

A more specific object of the present invention is to provide an optical head apparatus for which the adjustment of the optical components is facilitated.

The above objects are achieved by an optical head apparatus, comprising a case body having an open surface and a window through which an opto-electronics component can be positioned and housing optical components inside it, a lid being attachable and detachable with respect to the open surface of said case body, and a flexible printed circuit board having a base portion which is adhered to the lid and on which electronic components are mounted and a protruding portion protruding from the base portion and having an opto-electronic component fixed to the distal end portion of it, the opto-electronic component being electrically connected with an electronic circuit which is formed by the electronic component on the base portion of the flexible printed circuit board, the distal end portion of the protruding portion of the flexible printed circuit board being fixed to the case body so that the opto-electronic component is positioned to the window, whereby when the electronic circuit and the opto-electronic component are maintained in a status of electrical contact, the lid can be attached and detached with respect to the case body due to the bending of the protruding portion of the flexible printed circuit board.

DESCRIPTION OF THE PREFERRED EMBODIMENTS

Figure 1:
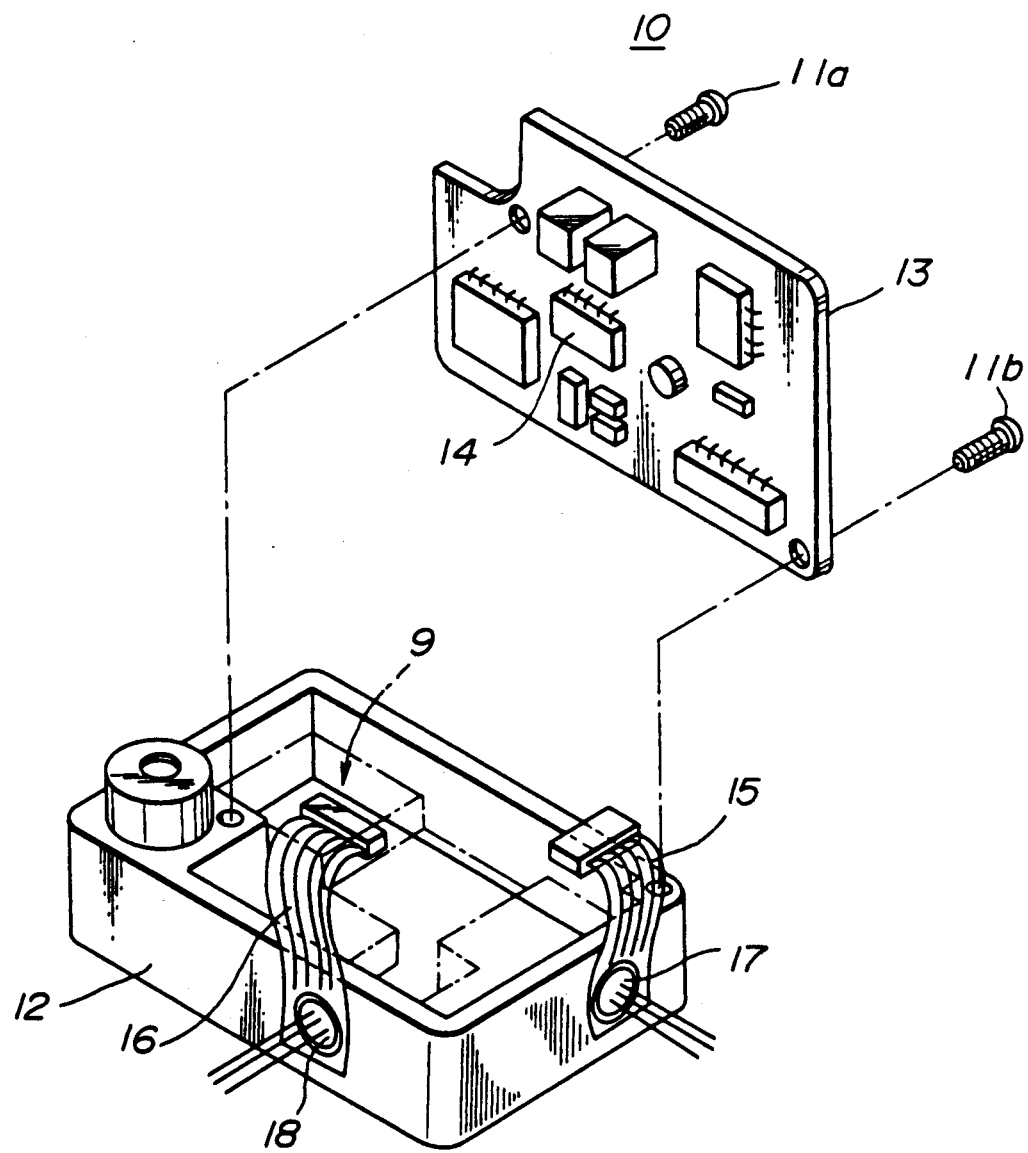
FIG. 1 is a perspective exploded view showing the structure of a conventional optical head apparatus.
Figure 2:
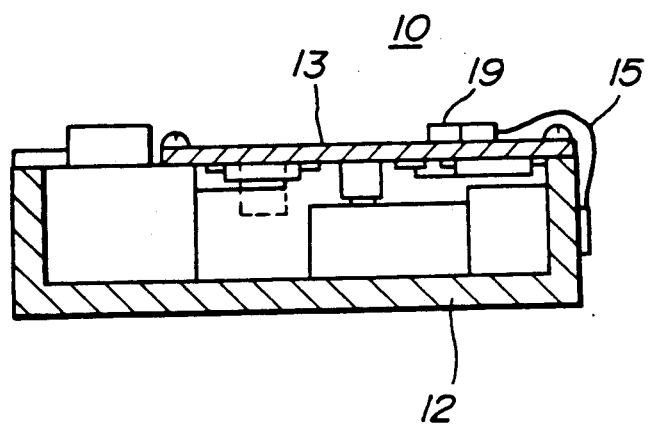
FIG. 2 is a section view showing the structure of a conventional optical head apparatus.
Figure 4:
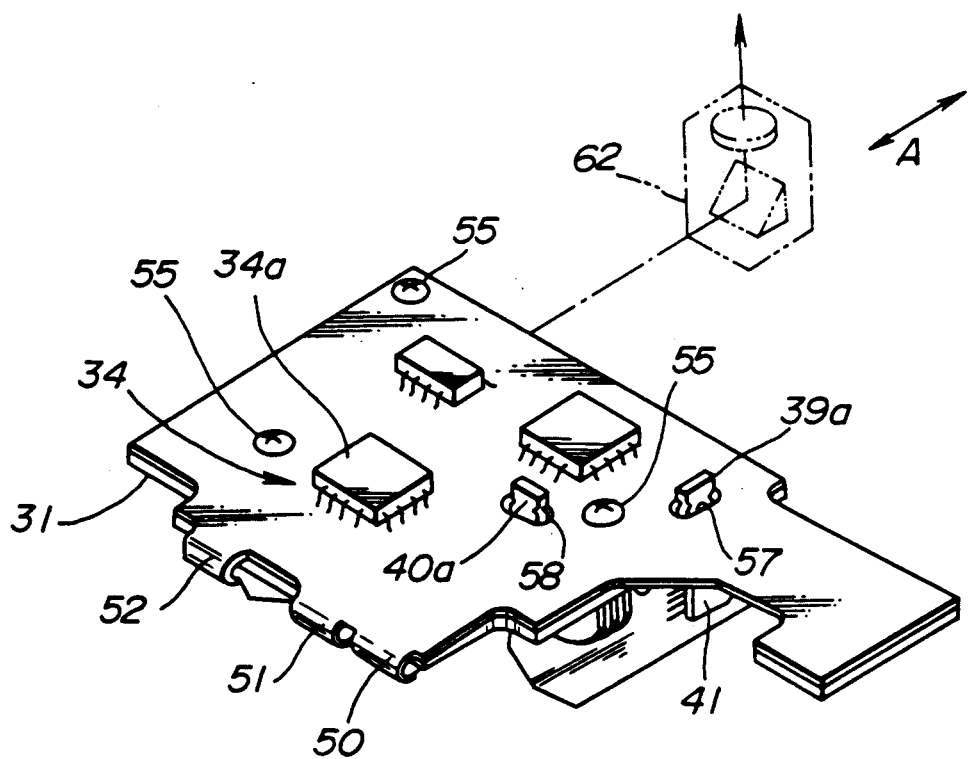
FIG. 4 is a perspective view showing an embodiment of an optical head apparatus according to the present invention, in the state where the lid has been attached to the case body.
Figure 3:
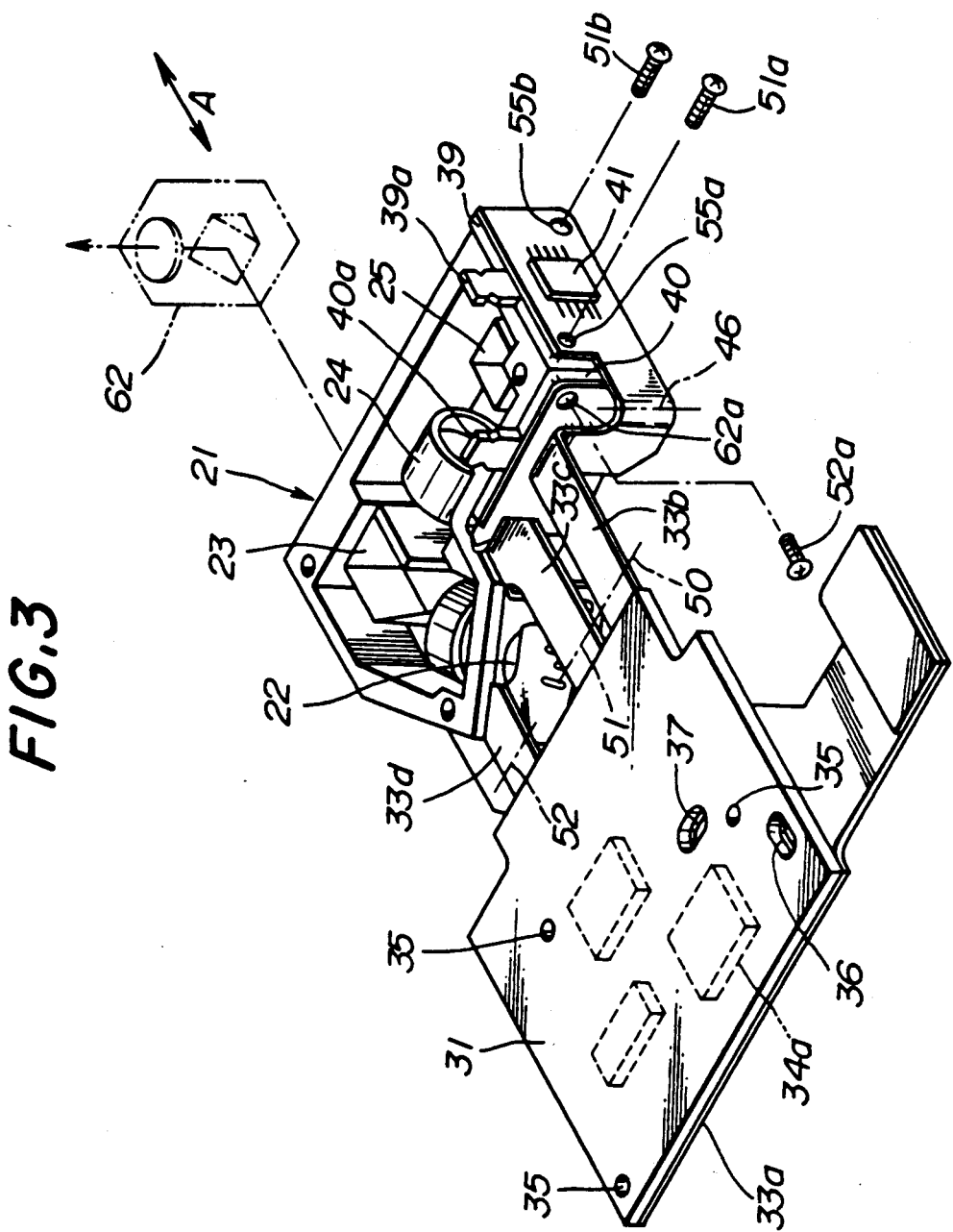
FIG. 3 is a perspective view showing an embodiment of an optical head apparatus according to the present invention, in the state where a lid has been removed from a case body.

An embodiment of the optical head apparatus according to the present invention is shown in FIG. 3 and FIG. 4.

Figure 5:
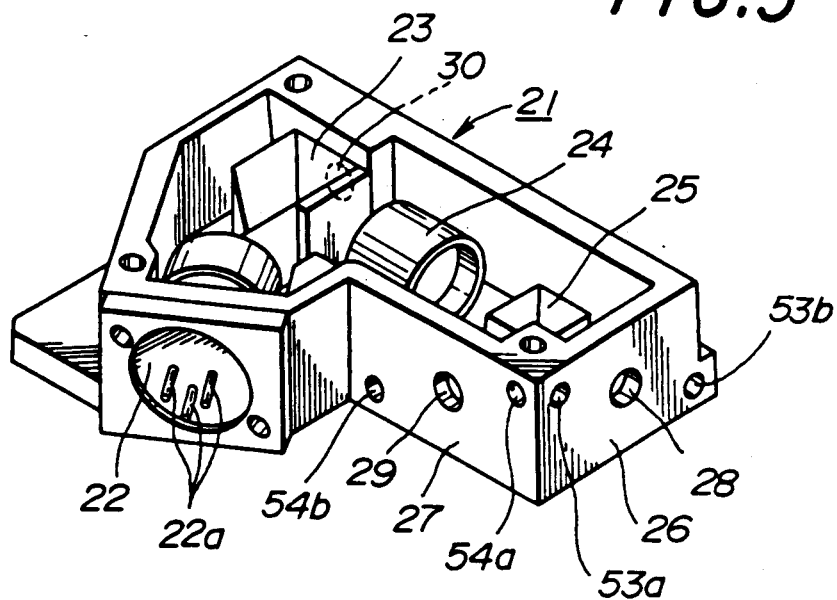
FIG. 5 is a perspective view showing the structure of the case body in FIG. 3.

A case body 21 has an opening provided on its upper surface and is formed of for example, an aluminum alloy. The case body 21, as shown in detail in FIG. 5, incorporates a semiconductor laser 22 (opto-electronic components), a beam splitter 23, a lens 24, a polarizing beam splitter 25 and other optical components. The side walls 26 and 27 of the case body 21 have light receiving elements mounted to them. These side walls 26 and 27 have windows 28 and 29 formed in them so as to allow the laser beam to pass through them. In addition, the corner portions of the side walls 26 and 27 have screw holes 53a, 53b, 53c and 53d formed in them to mount the light receiving elements. The wall of the case body 21 that is opposite the beam splitter 23 also has a window 30 formed in it so as to allow the laser beam to pass through.

A lid 31 is formed of the same aluminum alloy as the case body 21. The surface of the lid 31 has a flexible printed circuit board 33 adhered to it. The lid 31 also has holes 36 and 37 formed in it for adjustment knobs and holes 35 for screw fixing.

Figure 6:
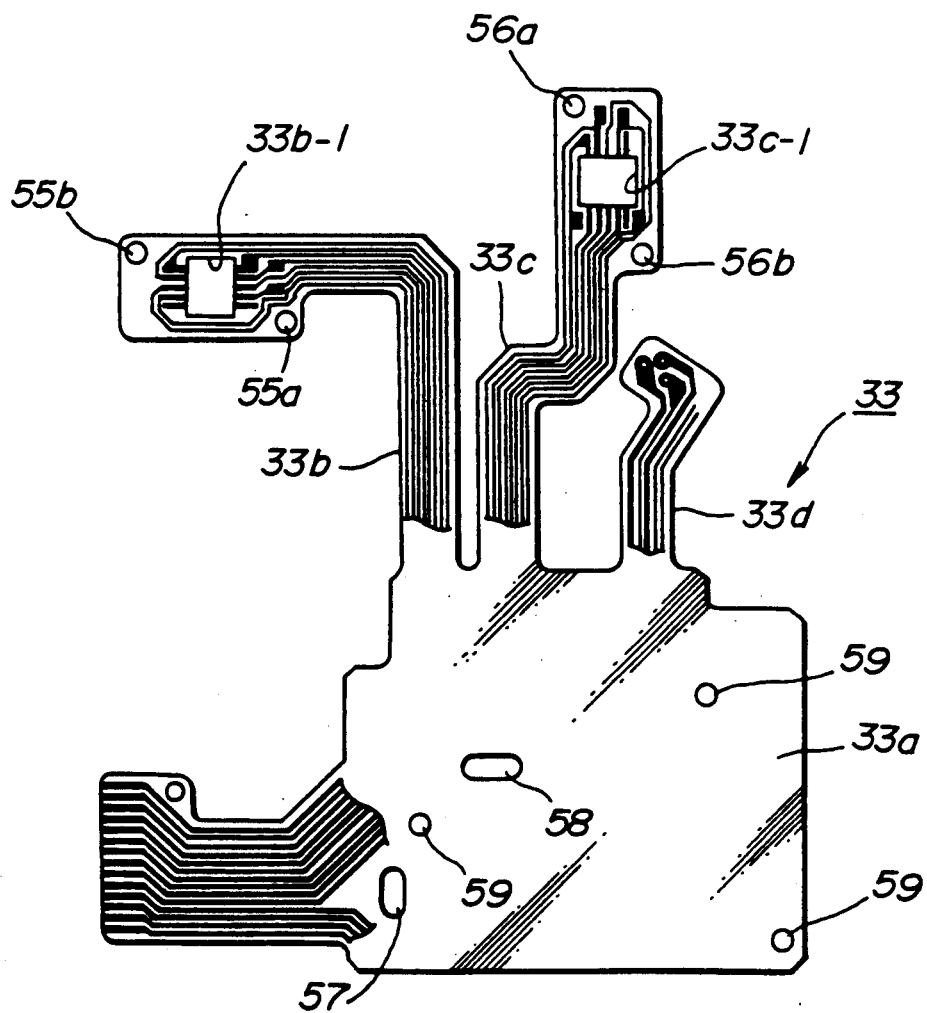
FIG. 6 is a view indicating the structure of a flexible printed circuit board in FIG. 3.

The flexible printed circuit board 33 is formed of a polyimide resin film. As shown in FIG. 6, this flexible printed circuit board 33 has a base portion 33a, a first arm portion 33b that is L-shaped, a second arm portion 33c that has a stepped shape and a third arm portion 33d that has a bend along its length. The first, the second and the third arm portions 33b, 33c, 33d protrude from one side of the base portion 33a. On the surface of the flexible printed circuit board 33 is formed a printed wiring pattern and IC, transistors, resistors, condensors and other electronic components is fixed to the base portion 33a by solder.

These electronic circuit configured by these electronic components 24a includes an automatic laser power control circuit (ALPC) 24 in order to perform output control of the semiconductor laser 22 for example.

Figure 8:
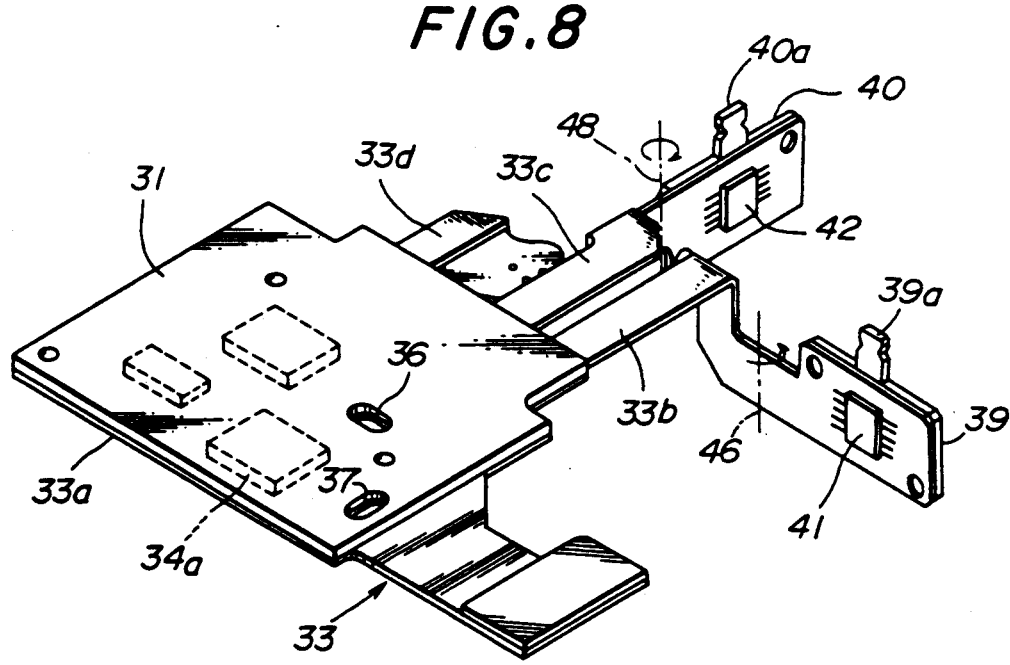
FIG. 8 is a perspective view indicating the status where each of the arm portions of the flexible printed circuit board are bent.

The underside of the base portion 33a of the flexible printed circuit board 33 is provide with an adhesive sheet which adheres the base portion 33a to the surface of the lid 31. In this manner, in the status where the flexible printed circuit board 33 is adhered to the lid 31, the first arm portion 33b, the second arm portion 33c and the third arm portion 33d of the flexible printed circuit board 33 protrude from one side of the lid 31. The distal end portions of the first arm portion 33b and the second arm portion 33c have formed in them rectangularly shaped windows 33b-1 and 33c-1. In addition, at predetermined positions on the distal end portions of the first arm portion 33b and the second arm portion 33c are formed holes 55a and 55b, and 56a and 56b. The undersides of the first arm portion 33b and the second arm portion 33c are provided with adhesive sheets and these adhesive sheets adhere the base boards 39 and 40 to the undersides of the distal end portions of the first arm portion 33b and second arm portion 33c. Adjustment knobs 39a and 40a protrude from predetermined sides of the base board 39 and 40. The adjustment knobs 39a (40a) and the base board 39 (40) are incorporated. The base board 39 has a window 39b and holes 61a and 61b formed in it so as to correspond to the window 33b-1 and holes 55a and 55b for the first arm portion 33b, and the base board 40 has a window 40b and holes 62a and 62b formed in it so as to correspond to the window 33c-1 and holes 56a and 56b for the second arm portion 33c. The base boards 39 and 40 are formed of an aluminum alloy in the same manner as the lid 31. As indicated in FIG. 8, the circuit patterns on the surfaces of the distal ends of the first arm portion 33b and the second arm portion 33c of the flexible printed circuit board 33 have light receiving elements (opto-electronic components) 41 and 42 soldered to them. The light receiving surfaces of these light receiving elements 41 and 42 are exposed from the windows 33b-1 and 33c-1 of the flexible printed circuit board 33 and the windows 39b and 40b of the base boards 39 and 40.

As indicated in FIG. 6, the base portion 33a of the flexible printed circuit board 33 has formed in it a holes 59 so as to correspond to the screw stop holes 35 and holes 57, 58 so as to correspond to the holes 36 and 37 formed in the lid 31.

The following is a description of the mounting the first arm portion 33b, the second arm portion 33c and the third arm portion 33b to the case body 21.

Figure 7:
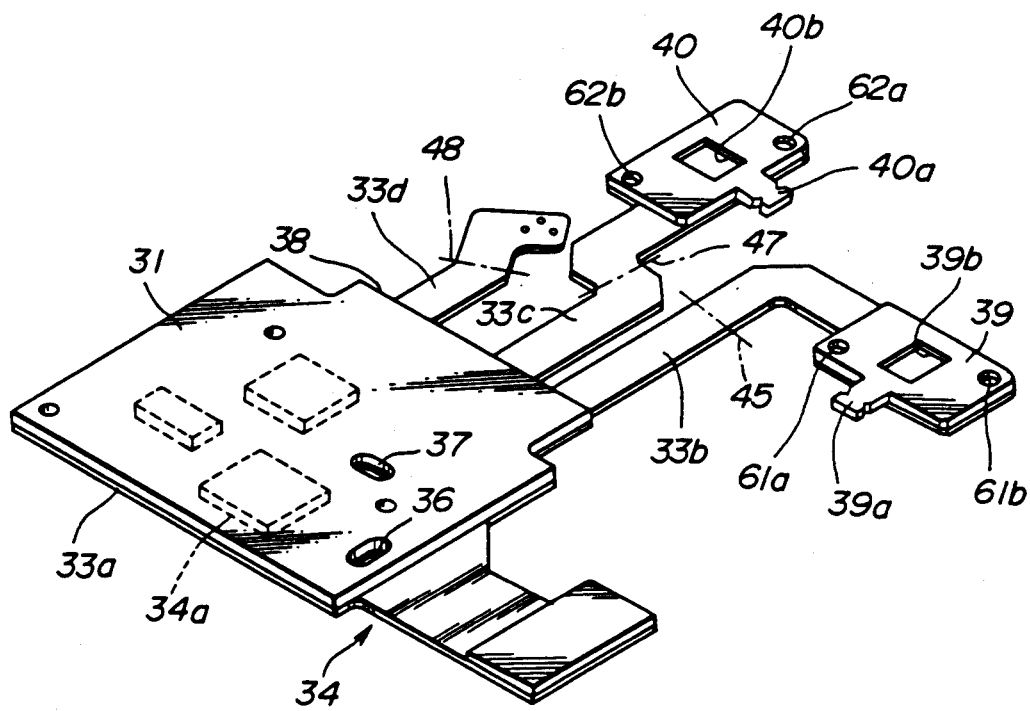
FIG. 7 is a perspective view indicating the status where the flexible printed circuit board is adhered to the lid.

As indicated in FIG. 7 the first arm portion 33b is bent downwards along a line 45 so that it is in the status shown in FIG. 8. Then, the first arm portion 33b is bent around line 46 and in the direction of the arrow as shown in FIG. 8. Then, as indicated in FIG. 3, the first arm portion 33b and the base board 39 form one unit and is fixed to the side wall 26 of the case body 21 (refer to FIG. 5) by the screws 51a and 51b passing through the holes 55a and 55b in the flexible printed circuit board 33 and the holes 61a and 61b in the printed circuit board 39.

The light receiving surface of the light receiving element 41 fixed to the flexible printed circuit board 33 opposes the window 28 of the side wall 26 and the laser beam that has passed the optical components inside the case body 21 is focussed on the surface of the light receiving element 41. The adjustment knob 39a formed on the base board 39 is in the status that it protrudes in the upwards direction from the top surface of the case body 21.

The second arm portion 33c is bent around the line 47 of FIG. 7, and in the downwards direction so that it is in the status indicated in FIG. 8. In addition, the second arm portion 33c is bent around the line 48 indicated in FIG. 3, the second arm portion 33c and the base board 40 form one unit and is fixed to the side wall 27 of the case body 21 (refer to FIG. 5) by the screws 52a and 52b (screw 52b is not indicated in the figure) passing through the holes 56a and 56b in the flexible printed circuit board 33 and through the holes 62a and 62b in the printed circuit board 40. The light receiving surface of the light receiving element 42 fixed to the flexible printed circuit board 33 opposes the window 29 in the side wall 27 and the laser beam that passes through the optical components inside the case body 21 is focussed on the light receiving surface. The adjustment knob 40b formed on the base board 40 is also in the status where it protrudes in the upwards direction from the case body 21 in the same manner as the previously mentioned adjustment knob 39b.

The third arm portion 33d is bent around the line 48 indicated in FIG. 7 and in the downwards direction so that it is in the status shown in FIG. 8. Then, as indicated in FIG. 3, terminals 22a of the semiconductor laser 22 (refer to FIG. 5) are inserted into holes in the circuit pattern formed on the distal end of the third arm portion 33d and this terminals 22a are soldered to the circuit pattern.

As has been described above, each of the distal end portions of the first arm portion 33b, the second arm portion 33c and third arm portion 33d of the flexible printed circuit board 33 that is adhered to the lid 31 are fixed to the case body 21 so that the case body 21 and the lid 31 are connected.

The lid 31 is mounted to the case body 21 in the following manner.

As indicated in FIG. 3, the first arm portion 33b, the second arm portion 33c and third arm portion 33d of the flexible printed circuit board 33 are each bent around the lines 50, 51 and 52 so that the lid 31 covers the upper surface of the case body 21. The lid 31 covers the upper surface of the opening in the case body 21. The adjustment knobs 39a and 40a formed on the base boards 39 and 40 protrude in the upwards direction through the holes 36 and 37 in the lid 31 and the holes 57 and 58 in the flexible printed circuit board 33. Then, the lid 31 is fixed to the case body 21 by the screws 55 passing through the holes 59 in the flexible printed circuit board 33 and the holes 35 in the lid 31. FIG. 4 indicates the status where the lid 31 and the flexible printed circuit board 33 are fixed together to become one unit. In this status, the first arm portion 33b, the second arm portion 33c and third arm portion 33d of the flexible printed circuit board 33 are in the status where they are bent in a U-shape around the portions 50, 51 and 52.

As has been described above, the case body 21, the lid 31 and the flexible printed circuit board 33 form an optical head 10 that is a single unit and this unit is mounted to a predetermined position (not indicated in the figure) on the chassis of the optical disc apparatus. Then, the objective lens assembly unit 62 indicated by a double-dotted line in FIG. 3 and FIG. 4, is controlled to move in the direction of the radius of the optical disc as indicated by the arrow A. The laser beam light emitted from the window 30 (refer to FIG. 5) formed in the wall of the case body 21 passes through the objective lens assembly unit 62 and is focussed on a track of an optical disc. In addition, the beam reflected from the surface of the optical disc passes through the window 30 and is led to the inside the case body 21. Then, this laser beam passes through the optical components inside the case body 21 and is focussed on the light receiving elements 41 and 42.

The following is a description of the adjustment and maintenance procedures for the optical components in the optical head 10 having the configuration as described above.

(1) Position adjustment of optical components inside the case body;

The screw 55 indicated in FIG. 4 is removed and the first arm portion 33b, the second arm portion 33c and the third arm portion 33d in the bent status are returned to the unbent status and the lid 31 is opened as indicated in FIG. 3. Whereby, the lid 31 can be removed from the case body 21 while the electronic circuit 34 is still electrically connected to the semiconductor laser 22 and the light receiving elements 41 and 42. Accordingly, it is possible to maintain the semiconductor laser 22 and the light receiving elements 41 and 42 in the operating status without performing the electrical reconnection work that has been necessary in the conventional optical head. A position adjustment work for the optical components inside the case body 21 can be performed immediately after the lid 31 has been removed from the case body 21. The work efficiency is therefore good.

After the positioning work has been performed, the lid 31 is screwed back to the case as indicated in FIG. 4.

(2) Maintenance:

The above described operations for removing the lid 31 from the case main body 21 are performed in the same manner for when maintenance is performed.

(3) Position adjustment of the light-receiving elements (opto-electronic components) 41 and 42;

This adjustment is possible without removing the lid 31 from the case body 21. That is to say, the screws 51a, 51b, 52a and 52b are loosened and the adjustment knobs 29a and 30a protruding through the holes 57 and 58 of the flexible printed circuit board 33 and above the flexible printed circuit board 33 are moved by tweezers or some appropriate tool so that the light receiving elements 41 and 42 are displaced the slightly along with the base boards 39 and 40 and fine adjustment is performed for the positions of the light receiving elements 41 and 42.

As has been described above, fine adjustment of the position of the light receiving elements 41 and 42 can be easily performed.

When the first arm portion 33b, the second arm portion 33c and the third arm portion 33d of the flexible printed circuit board 33 are bent, a spring force acts in the first arm portion 33b, the second arm portion 33c and the third arm portion 33d to return them to their former positions. This spring force is larger for the closer to the bend position. Accordingly, the distal end portions of the first arm portion 33b and the second arm portion 33c to which the light receiving elements 41 and 42 are fixed is weak, and this return spring force of the flexible printed circuit board 33 does not prevent the adjustment of the position of the light receiving elements 41 and 42.

The lid 31 is formed of aluminum alloy that is the same as that of the case body 21. The coefficients of thermal expansion of the lid 31 and the case body 21 are the same so that the case body 21 and the lid 31 expand and contract at the same rates. This means that unnecessary thermal stress is not generated in the case body 21 and so there is no distortion of the case body 21. This is to say that there is not mismatching of the optical axes of the optical components due to the distortion resulting from thermal stress.

In addition, the base portion 33a of the flexible printed circuit board 33 is adhered closely to the lid 31. This lid 31 is formed of an aluminum alloy of a metal which is a good thermal conductor and so the lid 31 functions as a radiator so that the heat generated by the electronic components 34a configuring the electronic circuit 34 on the base portion 33a of the flexible printed circuit board 33 is efficiently dissipated.

The present invention is not limited to the embodiment described above, as other embodiments such as one where the objective lens is also incorporated into the case can also be thought of.

In addition, a zinc alloy could also be used as a substitute for the aluminum alloy of the case body 21 and the lid 31.

In embodiment, the flexible printed circuit board 33 has a base portion 33a and first arm portion 33b, the second arm portion 33c and the third arm portion 33d that protrude from the base portion 33a but these first arm portion 33b, second arm portion 33c and third arm portion 33d can be formed as a single unit corresponding to the shape of the case body 21.

In an optical head apparatus according to the present invention, it is possible to remove the lid from the case body while still maintaining electrical contact. Accordingly, the position adjustment of the optical components inside the case body can be performed without having to performed electrical connection work after the lid has been removed from the case. This is to say that adjustment work and maintenance work performed after assembly is facilitated.

In addition, by the operation of the adjustment knobs, it is possible to perform fine adjustment of the mounting position of the light receiving elements while the lid is still mounted to the case. Furthermore, it is also possible to avoid thermal stresses in the case body and to also improve the heat dissipation ratio of the electronic components.

The present invention is not limited to the aforementioned embodiments, and variations and modifications may be made without departing from the scope of the invention.

What is claimed is:

1. An optical head apparatus applicable to an optical disc apparatus, comprising:
   a case body having an open surface and a window through which an opto-electronics component can be positioned and housing optical components inside it;
   a lid being attachable and detachable with respect to the open surface of said case body; and
   a flexible printed circuit board having a base portion which is adhered to said lid and on which electronic components are mounted, and a protruding portion protruding from said base portion and having an opto-electronic component fixed to the distal end portion of it, said opto-electronic component being electrically connected with an electronic circuit which is formed by said electronic component on said base portion of said flexible printed circuit board, the distal end portion of said protruding portion of said flexible printed circuit board being fixed to said case body so that said opto-electronic component is positioned to said window,
   whereby, when said electronic circuit and said opto-electronic component are maintained in a status of electrical contact said lid can be attached and detached with respect to said case body due to the bending of said protruding portion of said flexible printed circuit board.

2. The optical head apparatus as claimed in claim 1, wherein a plural number of the opto-electronic component is provided, said protruding portion of said flexible printed circuit board is formed for each of the opto-electronic components mounted to it.

3. The optical head apparatus as claimed in claim 1, wherein said protruding portion of flexible printed circuit board has an adjustment knob for position adjustment of the opto-electronic component along with said flexible printed circuit board, said adjustment knob being provided at a position at which the opto-electronic component is mounted.

4. The optical head apparatus as claimed in claim 1, wherein said protruding portion of said flexible printed circuit board has a base board fixed to a surface to which a printed pattern is not formed for the position at which the opto-electronic component is mounted, said protruding portion and said base board forming a single unit fixed to said case body.

5. The optical head apparatus as claimed in claim 1, wherein said case body is formed of one of an aluminum alloy and a zinc alloy, and wherein said lid is formed of the same material as said case body.

6. The optical head apparatus as claimed in claim 1, wherein said opto-electronic component is a light-emitting element.

7. The optical head apparatus as claimed in claim 1, wherein said opto-electronic component is a light receiving element.

8. The optical head apparatus of claim 4, wherein said base board has an adjustment knob to adjust a position of said opto-electronic component along with the flexible printed circuit board.

* * * * *